United States Patent [19]

Macks

[11] Patent Number: 5,757,601
[45] Date of Patent: May 26, 1998

[54] SHORT CIRCUIT PROTECTION FOR HIGH SIDE DRIVER

[75] Inventor: Harold Ryan Macks, Detroit, Mich.

[73] Assignee: Ford Motor Company, Dearborn, Mich.

[21] Appl. No.: 786,472

[22] Filed: Jan. 21, 1997

[51] Int. Cl.$^6$ .................................................. H02H 3/00
[52] U.S. Cl. ............................................. 361/93; 361/57
[58] Field of Search ................................. 361/54, 56, 57, 361/58, 93, 94, 100, 101

[56] References Cited

U.S. PATENT DOCUMENTS

| | | | |
|---|---|---|---|
| 3,967,207 | 6/1976 | Wheatley, Jr. | 330/23 |
| 4,291,357 | 9/1981 | Hong | 361/101 |
| 4,355,344 | 10/1982 | Felici et al. | 361/103 |
| 4,492,213 | 1/1985 | Yamamoto et al. | 123/644 |
| 4,520,418 | 5/1985 | Susi | 361/92 |
| 4,555,742 | 11/1985 | Gray et al. | 361/93 |
| 4,695,915 | 9/1987 | Mahalek et al. | 361/56 |
| 4,787,007 | 11/1988 | Matsumura et al. | 361/101 |
| 5,175,413 | 12/1992 | Holling et al. | 361/101 |
| 5,373,826 | 12/1994 | Taruya et al. | 123/634 |
| 5,694,282 | 12/1997 | Yockey | 361/86 |

*Primary Examiner*—Sally C. Medley
*Attorney, Agent, or Firm*—Mark S. Sparschu; Roger L. May

[57] ABSTRACT

A short circuit protection system that reacts to a voltage across an electrical load to prevent overdissipation of a semiconductor switch in the event of a short circuit. The system includes a capacitor having a charge state. When the capacitor is charged, the electrical load is turned ON via a transistor. The system automatically latches the electrical load ON until a short circuit occurs or until the capacitor discharges. When a short circuit occurs, the system automatically turns the load OFF.

19 Claims, 3 Drawing Sheets

5,757,601

1

SHORT CIRCUIT PROTECTION FOR HIGH SIDE DRIVER

TECHNICAL FIELD

This invention relates to fault protection mechanisms for electronic systems.

BACKGROUND ART

In the control of an electrical component, a semiconductor switch such as a transistor can be used. A semiconductor switch will typically controllably transform between a conducting state and a nonconducting state to turn the electrical component ON and OFF, respectively.

One concern in the control of electrical components is in short circuit protection of the semiconductor switches involved. Consider, for example, if a semiconductor switch is used at the high side of an electrical component. An inadvertent short circuit to ground which occurs at the high side of the electrical component can cause the semiconductor switch to "overdissipate" when the semiconductor switch turns ON. The result can be greatly excessive power dissipation within the semiconductor switch, potentially damaging or destroying the semiconductor switch.

One known short circuit protection system utilizes a current sense scheme as shown in FIG. 1.

A low impedance resistive element R1 is used to sense current flowing through the drive transistor Q2. Once the current through the resistor R1 becomes too high, sufficient voltage is generated. This voltage causes a sense element Q3 to turn ON so that a microprocessor is notified of the short circuit. Once the microprocessor determines that an over current condition exists, the microprocessor can shut off the drive element. This scheme, however, has several disadvantages, such as a false over current condition being detected since a voltage drop across R1 occurs under normal drive conditions, and additional costs due to several additional external components and to the microprocessor having an interrupt pin with high priority.

A second known short circuit protection system utilizes a voltage sense scheme as shown in FIG. 2. A resistor divider (R1 and R2) coupled to the load provides a feedback to the microprocessor. Once an over current condition occurs, a drive transistor Q2 is typically current limited through the selection of a base resistor R3. Therefore, a voltage drop occurs at the load during a low impedance short. The microprocessor polls the voltage divider input. Once this input registers as a low, the short circuit is sensed and the microprocessor can shut off the output. This scheme, however, requires the drive transistor Q2 to be oversized in order to dissipate the power it must endure while the microprocessor is polling the diagnostic input. In addition, this scheme involves additional costs due to the additional microprocessor pin required for diagnostics.

Thus, a system which provides effective short circuit protection with minimal complexity will provide advantages over the prior art.

DISCLOSURE OF THE INVENTION

It is thus a general object of the present invention to provide a cost-effective and reliable short circuit protection system for a high side driver.

In carrying out the above object and other objects, features, and advantages of the present invention, the system includes a first terminal and a second terminal. The system

2 also includes a first transistor in electrical communication with the first and second terminals, the first transistor having an OFF state in which substantially no current flows through the first terminal, the first transistor, and the second terminal and having an ON state in which current flows substantially from the first terminal to the first transistor and the second terminal. Still further, the system includes a capacitor having a charge state. Finally, the system includes a second transistor in electrical communication with the capacitor and the first transistor, wherein the second transistor is in electrical communication with the second terminal to force the first transistor OFF if the voltage at the second terminal is less than a predetermined value, the first transistor is ON and the capacitor is in the charge state.

The above object and other objects, features and advantages of the present invention are readily apparent from the following detailed description of the best mode for carrying out the invention when taken in connection with the accompanying drawings.

BEST MODES FOR CARRYING OUT THE INVENTION

Figure 1:
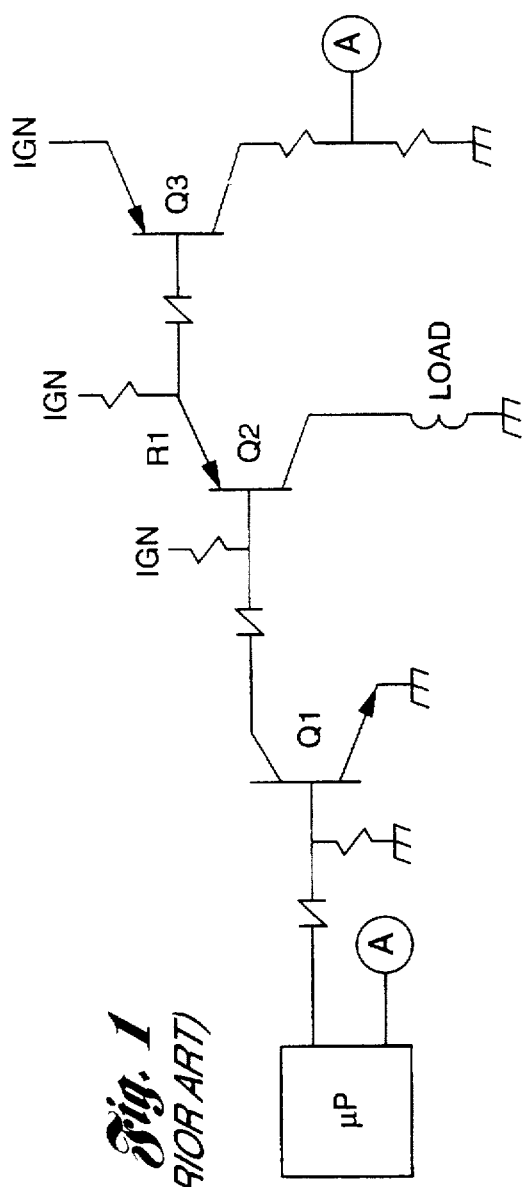
FIG. 1 is an electrical schematic of a prior art short circuit protection system utilizing a current sense scheme.
Figure 2:
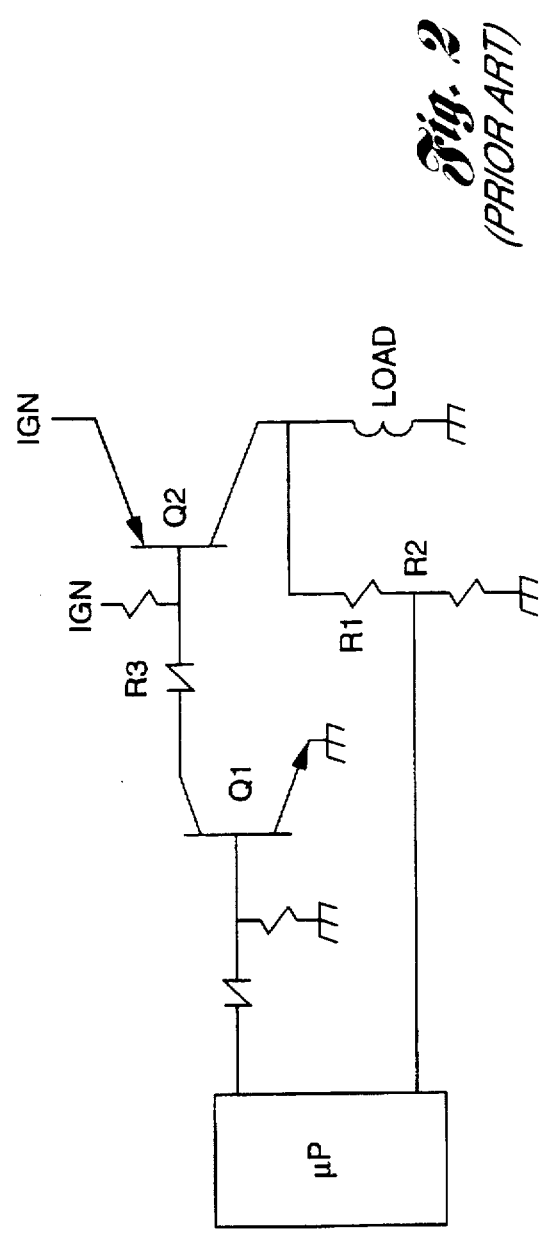
FIG. 2 is an electrical schematic of a prior art short circuit protection system utilizing a voltage sense scheme.
Figure 3:
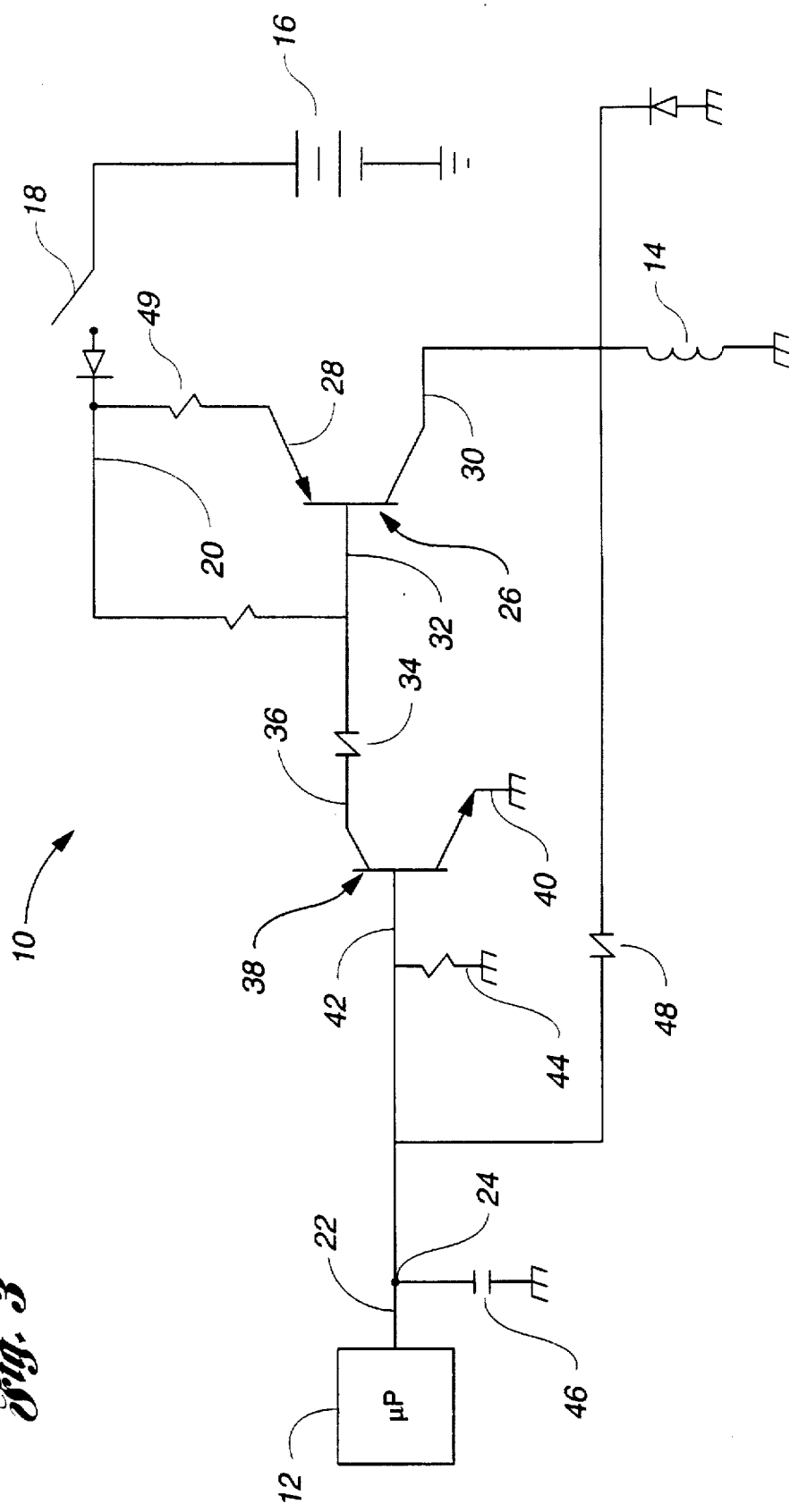
FIG. 3 is an electrical schematic of a short circuit protection system according to a first embodiment of the present invention.

Referring now to FIG. 3, a short circuit protection system 10 according to one embodiment of the present invention will be described. The system 10 includes a microprocessor 12 which is adapted to control an electrical load 14. As will be described, systems according to the present invention can be used to particular advantage if the electrical impedance of the electrical load 14 has a significant inductive component. A solenoid is one such electrical load.

The system 10 includes a source of electrical power such as a battery 16, which is coupled to the electrical load 14 via a switch 18, such as an ignition switch of a motor vehicle. Circuit 20 thus has a nominal voltage of 12 volts DC when the ignition switch 18 is closed.

The microprocessor 12 is responsible for commanding switchable control of current through the electrical load 14. The microprocessor 12 runs an appropriate control algorithm stored in memory to determine when current should and should not be provided through the electrical load 14 (that is, when the electrical load 14 should be turned ON and OFF). Microprocessor 12 includes a pin or terminal 22. The terminal 22 can be configured under software control as an output or as an input. If configured as an output, terminal 22 can actively drive node 24 to a logic HIGH level (for example, approximately 5 volts) and to a logic LOW level (for example, approximately zero volts). If configured as an input, terminal 22 assumes a high-impedance state in which microprocessor 12 monitors the logic level of the voltage at terminal 22. An example of a microprocessor having a pin which can be so alternately configured as an input or an output is the 68HC11 from Motorola Corporation.

The system 10 includes a p-n-p transistor 26. Emitter 28 of transistor 26 is coupled via the ignition switch 18 to battery 16 through resistor 49. Collector 30 is coupled to the high side of the electrical load 14. Transistor 26 is thus configured to control current from circuit 20 through electrical load 14 to ground. Base 32 is coupled via a resistor 34 to a collector 36 of an n-p-n transistor 38. Emitter 40 of the transistor 38 is coupled to ground. Base 42 of the transistor 38 is coupled to the terminal 22 of the microprocessor 12.

The system 10 of FIG. 3 operates as follows. If microprocessor 12 decides according to its algorithm for electrical load 14 that electrical load 14 should be ON, microprocessor 12 will configure terminal 22 as an output and will drive node 24 to a logic HIGH level for a predetermined amount of time, e.g., 150 usec. This results in capacitor 46 being charged to 5 VDC. This charge will saturate transistor 38. With transistor 38 saturated, transistor 26 will also saturate and battery 16 will be applied to the electrical load 14, less the Vce of transistor 26 and a small voltage drop across resistor 49. Resistor 48 provides a feedback path to allow transistor 38 to stay in saturation, thereby allowing the electrical load 14 to be energized. After turning electrical load 14 ON, the microprocessor 12 then reconfigures terminal 22 as an input, terminal 22 thus assuming a high-impedance state.

If microprocessor 12 subsequently decides according to its control algorithm that electrical load 14 should be OFF, microprocessor 12 configures terminal 22 as an output and drives node 24 LOW for a predetermined amount of time, e.g., 150 usec., and then terminal 22 returns as an input. This results in the charge on capacitor 46 to be discharged through terminal 22 of the microprocessor 12. When capacitor 46 discharges, transistor 38 will go into its cut-off region. With transistor 38 in its cut-off region, transistor 26 will also go into its cut-off region and the electrical load 14 will be turned OFF. Resistor 48 provides a feedback path to allow transistor 38 to remain in its cut-off region, thereby allowing the electrical load 14 to continue to be de-energized.

The short circuit protection function of the system 10 of FIG. 3 will now be described. Assume that microprocessor 12 has turned ON electrical load 14 as described above. If a short circuit fault exists such that ground voltage appears at the high side of electrical load 14, transistor 26 would overdissipate absent the short circuit protection function which will next be described.

Capacitor 46 is charged to approximately 5.0 volts by voltage applied by transistor 26 being divided by the series combination of resistors 48, 44 and 34. Once a short circuit appears across the electrical load 14, resistors 34 and 49 act to limit the current that is supplied by transistor 26. Therefore, the voltage at the electrical load 14 will drop to essentially zero volts. Once this voltage drop occurs, capacitor 46 discharges through the feedback resistor 48. When the voltage across capacitor 46 drops low enough to no longer sustain the forward bias voltage of the Vbe of transistor 38, transistor 38 goes into its cut-off region, followed by transistor 26 going into its cut-off region. With transistor 26 in its cut-off region, the electrical load 14 is de-energized and the transistor 26 is protected from excessive current and power. An R-C time constant defined by capacitor 46 and resistor 48 is selected to be short enough to cause transistor 26 to turn OFF before a serious period of overdissipation occurs.

Figure 4:
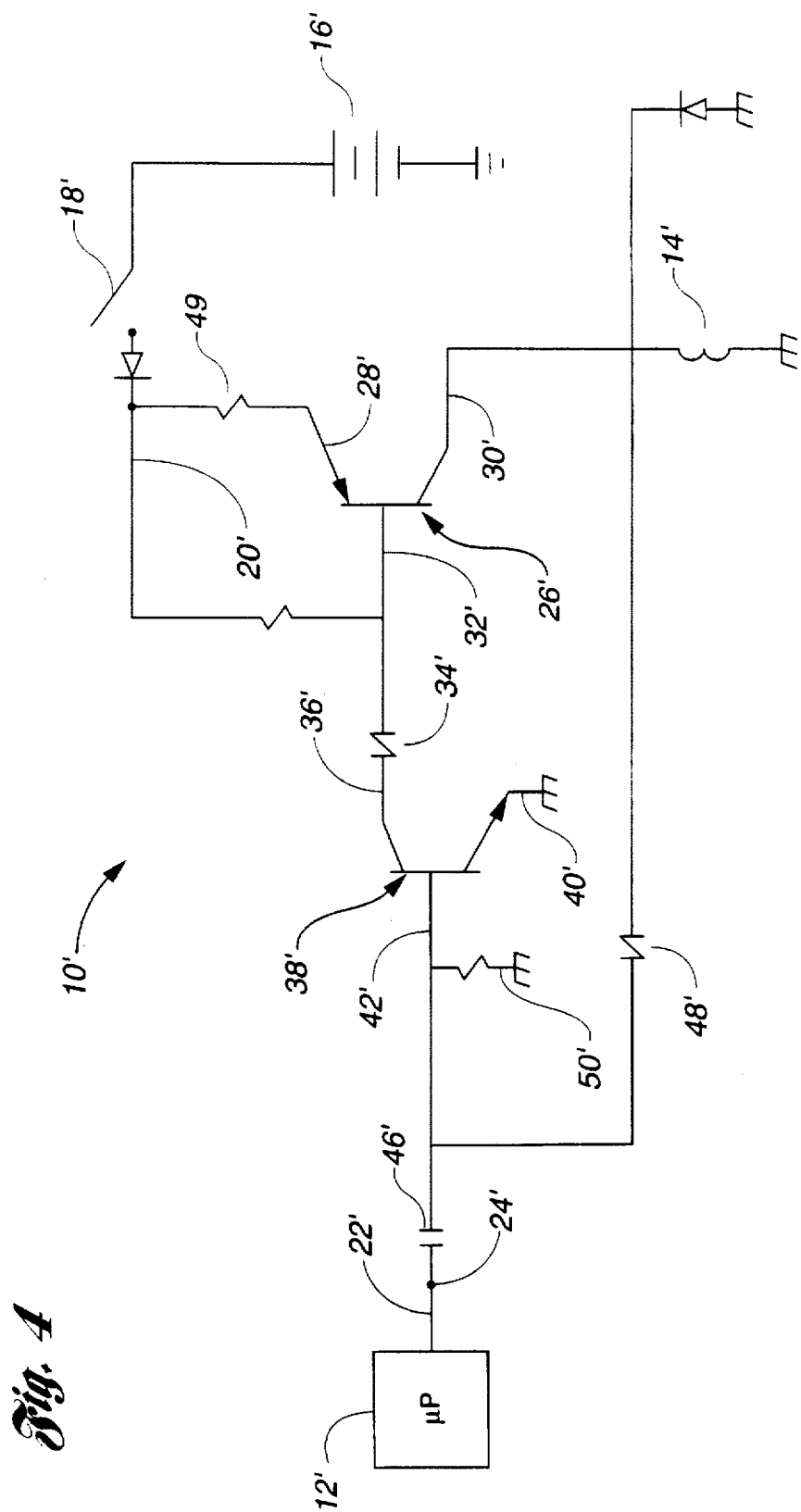
FIG. 4 is an electrical schematic of a short circuit protection system according to a second embodiment of the present invention.

A second short circuit protection system is shown in FIG. 4. The second embodiment is nearly the same as the first embodiment, however, one terminal of the capacitor 46' is coupled to the base 42' of transistor 38'. In this configuration, the microprocessor 12' does not require a bi-directional pin.

The function of the circuit depends on the AC coupling of the charge across capacitor 46'. To turn ON the electrical load 14', the microprocessor terminal 22' transitions from ground level to 5.0 V.

The result is a charge being coupled to resistor 50'. This coupling allows transistor 38' to be saturated which, in turn, saturates transistor 26' so as to turn ON the electrical load 14'.

To turn OFF the electrical load 14', microprocessor 12 transitions terminal 22' from 5.0 V to ground. The charge present on resistor 50' is removed causing transistor 38' to go into its cut-off region and subsequently causing transistor 26' to go into its cut-off region also. Therefore, with capacitor 46' in this configuration, terminal 22' of microprocessor 12' does not need to be configurable as an input.

The short circuit protection function of the system 10' of FIG. 4 will now be described. Assume that microprocessor 12' has turned ON electrical load 14', as described above. If a short circuit occurs, such that ground voltage is applied to electrical load 14', resistors 49' and 34' limit the current through transistor 26'. Since ground voltage is now applied at the high side of electrical load 14', capacitor 46' discharges through resistor 48' causing transistor 38' to enter its cut-off region, thereby forcing transistor 26' into its cut-off region. With transistor 26' in its cut-off region, the electrical load 14' is de-energized.

While the best modes for carrying out the invention have been described in detail, those familiar with the art to which this invention relates will recognize various alternative designs and embodiments for practicing the invention as defined by the following claims.

What is claimed is:

1. A short circuit protection system comprising:

a first terminal and a second terminal;

an output PNP transistor having an emitter and a collector coupled to said first and second terminals, respectively, wherein said PNP transistor has an OFF state in which substantially no current flows through said first terminal, said PNP transistor and said second terminal, and has an ON state in which current flows substantially from said first terminal to said PNP transistor and said second terminal;

a capacitor in electrical communication with said second terminal and having a charge state and a discharge state dependent upon a voltage level at said second terminal; and a drive NPN transistor having a collector coupled to a base of said PNP transistor and having a base coupled to said capacitor and said second terminal to force said PNP transistor to the OFF state if said voltage at said second terminal is less than a predetermined value and said capacitor is in said discharge state so as to protect said PNP transistor from damage due to excessive power dissipation.

2. The short circuit protection system as recited in claim 1 further comprising a feedback resistor coupled between said second terminal and said capacitor.

3. The short circuit protection system as recited in claim 2 further comprising a microprocessor coupled to said capacitor for forcing said capacitor into said charge state.

4. The short circuit protection system as recited in claim 3 wherein said microprocessor includes a terminal configurable as an output for a predetermined amount of time to charge and discharge said capacitor and alternatively configurable to have a high impedance state to allow said charge state of said capacitor to be controlled by said second terminal.

5. The short circuit protection system as recited in claim 4 wherein said capacitor includes a first capacitor terminal and a second capacitor terminal and wherein said first capacitor terminal is in electrical communication with said microprocessor terminal and said second terminal and said base of said NPN transistor and wherein said second capacitor terminal is coupled to ground.

6. The short circuit protection system as recited in claim 4 wherein said high impedance state of said microprocessor terminal is an input state.

7. The short circuit protection system as recited in claim 3 wherein said microprocessor includes an output terminal providing a logic high level to force said capacitor into said charge state.

8. The short circuit protection system as recited in claim 7 wherein said capacitor includes a first capacitor terminal and a second capacitor terminal and wherein said first capacitor terminal is in electrical communication with said microprocessor terminal and said second capacitor terminal is in electrical communication with said second terminal and said base of said NPN transistor.

9. The short circuit protection system as recited in claim 1 further comprising an electrical load coupled to said second terminal.

10. The short circuit protection system as recited in claim 9 wherein said electrical load has a relatively higher voltage side and a relatively lower voltage side, said relatively higher voltage side is in electrical communication with said second terminal and said relatively lower voltage side coupled to ground.

11. A short circuit protection system for a high side output driver comprising:

a power source;

an electrical load;

an output PNP transistor having an emitter and a collector coupled to said power source and said electrical load, respectively, wherein said PNP transistor has an OFF state in which substantially no current flows through said electrical load and an ON state in which current flows substantially to said electrical load;

a capacitor in electrical communication with said load and having a charge state and a discharge state dependent upon a voltage level at said load; and a drive NPN transistor having a collector coupled to a base of said PNP transistor and having a base coupled to said capacitor and said electrical load to force said PNP transistor to the OFF state if said voltage across said electrical load is less than a predetermined value and said capacitor is in said discharge state so as to protect said PNP transistor from damage due to excessive power dissipation.

12. The short circuit protection system as recited in claim 11 further comprising a feedback resistor coupled between said load and said capacitor.

13. The short circuit protection system as recited in claim 12 further comprising a microprocessor coupled to said capacitor for forcing said capacitor into said charge state.

14. The short circuit protection system as recited in claim 13 wherein said microprocessor includes a terminal configurable as an output for a predetermined amount of time to charge and discharge said capacitor and alternatively configurable to have a high impedance state to allow said charge state of said capacitor to be controlled by said load.

15. The short circuit protection system as recited in claim 14 wherein said capacitor includes a first capacitor terminal and a second capacitor terminal and wherein said first capacitor terminal is in electrical communication with said microprocessor terminal and said electrical load and said base of said NPN transistor and wherein said second capacitor terminal is coupled to ground.

16. The short circuit protection system as recited in claim 14 wherein said high impedance state of said microprocessor terminal is an input state.

17. The short circuit protection system as recited in claim 13 wherein said microprocessor includes an output terminal providing one of a logic high level to force said capacitor into said charge state.

18. The short circuit protection system as recited in claim 17 wherein said capacitor includes a first capacitor terminal and a second capacitor terminal and wherein said first capacitor terminal is in electrical communication with said microprocessor terminal and said second capacitor terminal is in electrical communication with said electrical load and said base of said NPN transistor.

19. The short circuit protection system as recited in claim 11 wherein said electrical load has a relatively higher voltage side and a relatively lower voltage side, said relatively higher voltage side in electrical communication with said collector of said PNP transistor and said relatively lower voltage side coupled to ground.

* * * * *